(12) United States Patent
Hsu et al.

(10) Patent No.: US 12,132,075 B2
(45) Date of Patent: Oct. 29, 2024

(54) METHOD (AND RELATED APPARATUS) FOR FORMING A RESISTOR OVER A SEMICONDUCTOR SUBSTRATE

(71) Applicant: Taiwan Semiconductor Manufacturing Company, Ltd., Hsinchu (TW)

(72) Inventors: Hung-Wen Hsu, Tainan (TW); Jiech-Fun Lu, Madou Township (TW); Li-Weng Chang, Sanxia Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 338 days.

(21) Appl. No.: 17/412,456

(22) Filed: Aug. 26, 2021

(65) Prior Publication Data
US 2023/0063793 A1 Mar. 2, 2023

(51) Int. Cl.
*H01L 29/06* (2006.01)
*H01L 21/311* (2006.01)
*H01L 21/3213* (2006.01)
*H01L 23/522* (2006.01)
*H01L 23/528* (2006.01)
*H01L 27/06* (2006.01)
*H01L 49/02* (2006.01)

(52) U.S. Cl.
CPC ........ *H01L 28/20* (2013.01); *H01L 21/31116* (2013.01); *H01L 21/32134* (2013.01); *H01L 23/5226* (2013.01); *H01L 23/528* (2013.01); *H01L 27/0688* (2013.01)

(58) Field of Classification Search
CPC ..... H01L 28/20; H01L 28/24; H01L 23/5226; H01L 23/528; H01L 23/5228; H01L 23/53295; H01L 23/647; H01L 21/31116; H01L 21/32134; H01L 27/0688
See application file for complete search history.

(56) References Cited

U.S. PATENT DOCUMENTS 4,878,770 A * 11/1989 Ruggierio ......... H01L 23/53223
338/307
6,165,862 A * 12/2000 Ishikawa ................. H01L 28/24
438/384

(Continued)

FOREIGN PATENT DOCUMENTS

| TW | 201203461 A | 1/2012 |
| WO | 8903121 A1 | 4/1989 |

*Primary Examiner* — Mary A Wilczewski
*Assistant Examiner* — Tsz K Chiu
(74) *Attorney, Agent, or Firm* — Eschweiler & Potashnik, LLC

(57) ABSTRACT

Various embodiments of the present disclosure are directed towards an integrated chip (IC). The IC comprises a substrate. A resistor overlies the substrate. The resistor comprises a resistive structure overlying the substrate. The resistor also comprises a conductive contact overlying and electrically coupled to the resistive structure. A capping structure is disposed over the conductive contact, wherein the capping structure extends laterally over an upper surface of the conductive contact and vertically along a first sidewall of the conductive contact, such that a lower surface of the capping structure is disposed below a lower surface of the conductive contact.

20 Claims, 9 Drawing Sheets

(56) References Cited

U.S. PATENT DOCUMENTS

| | | | |
|---|---|---|---|
| 6,855,585 B1* | 2/2005 | Kalnitsky | H01L 27/0802 257/E27.047 |
| 7,332,403 B1* | 2/2008 | Hill | H01L 28/20 257/E27.047 |
| 7,410,879 B1* | 8/2008 | Hill | H01L 28/24 438/384 |
| 7,829,428 B1* | 11/2010 | Leng | H01L 28/20 257/E27.047 |
| 8,193,603 B2* | 6/2012 | Klatt | H01L 21/76816 257/532 |
| 2001/0016396 A1* | 8/2001 | Lee | H01L 27/0802 257/E27.047 |
| 2005/0003673 A1* | 1/2005 | Mahdavi | H01L 21/32136 257/E21.311 |
| 2005/0202219 A1* | 9/2005 | Yamashita | H01L 23/5228 428/209 |
| 2005/0236676 A1* | 10/2005 | Ueno | H01L 28/24 257/539 |
| 2006/0181388 A1* | 8/2006 | Chinthakindi | H01L 27/0688 257/E27.026 |
| 2007/0176295 A1* | 8/2007 | Chinthakindi | H01L 23/5226 438/666 |
| 2009/0302993 A1* | 12/2009 | Fujiwara | H01L 28/24 338/314 |
| 2010/0073122 A1* | 3/2010 | Le Neel | H01L 23/5228 338/25 |
| 2010/0136764 A1* | 6/2010 | Dirnecker | H01L 21/76838 257/E21.004 |
| 2010/0237467 A1* | 9/2010 | Dalton | H01L 21/76832 257/E29.325 |
| 2010/0308436 A1* | 12/2010 | Nanjo | H01L 23/5228 257/536 |
| 2011/0291225 A1* | 12/2011 | Klatt | H01L 28/60 257/506 |
| 2012/0049323 A1* | 3/2012 | Ng | H01L 28/20 257/E21.004 |
| 2014/0239449 A1* | 8/2014 | Dirnecker | H01L 27/0802 257/536 |
| 2017/0221797 A1* | 8/2017 | Tseng | H01L 28/24 |
| 2017/0278747 A1* | 9/2017 | Adusumilli | H01L 21/76897 |
| 2021/0134940 A1* | 5/2021 | Kuo | H01L 28/24 |

* cited by examiner

METHOD (AND RELATED APPARATUS) FOR FORMING A RESISTOR OVER A SEMICONDUCTOR SUBSTRATE

BACKGROUND

Modern integrated chips use a wide range of devices to achieve varying functionalities. In general, integrated chips comprise active devices and passive devices. Active devices include transistors (e.g., metal-oxide-semiconductor field-effect transistor (MOSFETs)), while passive devices include inductors, capacitors, and resistors. Resistors are widely used in many applications such as resistor-capacitor (RC) circuits, power drivers, power amplifiers, radio frequency (RF) applications, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
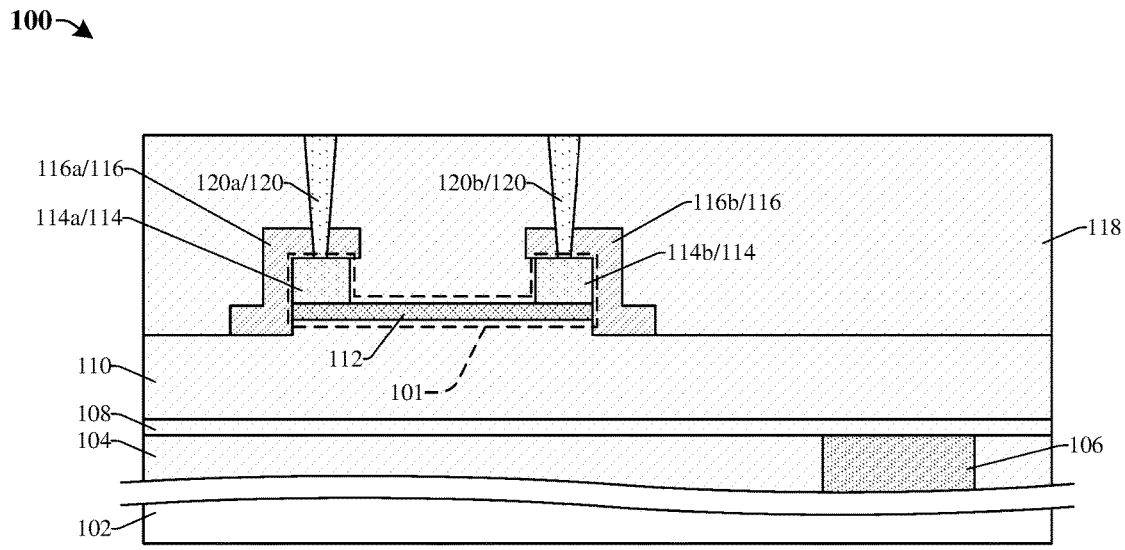
FIG. 1 illustrates a cross-sectional view of some embodiments of an integrated chip (IC) comprising a resistor disposed over a substrate.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Integrated chips (ICs) may have passive devices disposed over/within a substrate. The passive devices may be or comprise, for example, inductors, resistors, capacitors, diodes, or the like. One type of resistor used in an IC is a thin film resistor (TFR). A TFR comprises a resistive structure, a first conductive contact, and a second conductive contact laterally spaced from the first conductive contact. Conductive vias (e.g., metal vias) are electrically coupled to and extend vertically from the first and second conductive contacts.

Typically, a method for forming the above TFR comprises forming a resistive layer (e.g., silicon chromium (SiCr)) over the substrate. A conductive layer (e.g., titanium nitride (TiN)) is then formed over the resistive layer. A capping layer (e.g., silicon nitride (SiN)) is then formed over the conductive layer. Thereafter, the resistive layer, the conductive layer, and the capping layer are patterned to form the resistive structure, a conductive structure, and a capping structure, respectively. Outer sidewalls of the conductive structure are exposed when forming the resistive structure, the conductive structure, and the capping structure. A central portion of the capping structure is then removed (e.g., via a dry etching process) to expose a central portion of the conductive structure.

Thereafter, the central portion of the conductive structure is removed to form the first and second conductive structures on the resistive structure. Typically, the central portion of the conductive structure is removed via a wet etching process (e.g., a hydrogen peroxide ($H_2O_2$) wet etch)). Because of the relatively thin thickness (e.g., less than or equal to about 50 angstroms (Å)) of the resistive structure, the wet etching process is utilized because the wet etching process can be controlled to stop on the resistive structure (e.g., the resistive structure acts and an etch stop). For example, if a different type of etching process (e.g., dry etch) is utilized to remove the central portion of the capping structure, the different type of etching process may over etch the resistive structure (e.g., unintentionally remove portions of the resistive structure), thereby increasing a cost to form the IC (e.g., due to over etching of the resistive structure reducing device yield).

While the etching process is advantageous in forming the TFR due to the etching process stopping on the resistive structure, the etching process is disadvantageous in forming the TFR due to the etching process laterally etching exposed portions of the conductive structure (e.g., the $H_2O_2$ etch is isotropic). More specifically, the lateral etching of the conductive structure undesirably reduces the footprints (e.g., upper surface areas) of the first and second conductive contacts. The reduced footprints of the first and second conductive contacts make it more difficult to form conductive vias that are electrically coupled to the first and second conductive contacts. More specifically, the reduced footprints reduce landing zones in which the conductive vias must be formed on so that the conductive vias are electrically coupled to the first and second conductive contacts. Thus, the reduced footprints of the first and second conductive contacts may increase the cost to form the IC (e.g., due to the smaller footprints increasing misalignment issues, thereby decreasing device yield).

Various embodiments of the present application are directed toward a method for forming an integrated chip (IC). The method comprises forming a resistive layer over a substrate and a conductive layer over the resistive layer. The resistive layer and the conductive layer are then patterned to form a resistive structure and a conductive structure, respectively. A capping layer is then formed over the resistive structure and the conductive structure. The capping layer is formed covering an upper surface of the conductive structure and covering outer sidewalls of the conductive structure. The capping layer is then patterned to form capping structures that cover peripheral portions of the upper surface of the conductive structure and the outer sidewalls of the conductive structure. Patterning the capping layer also exposes a central portion of the conductive structure.

Thereafter, an etching process (e.g., a $H_2O_2$ wet etch) is performed to remove the central portion of the conductive structure, thereby forming first and second conductive contacts on the resistive structure. Because the capping structures cover the peripheral portions of the upper surface of the conductive structure and the outer sidewalls of the conductive structure, the capping structures prevent the etching process from laterally etching these portions of the conductive layer. Thus, the capping structures may increase the footprints of the first and second conductive contacts. Accordingly, the capping structures may reduce the cost to form the IC (e.g., due to the larger footprints decreasing misalignment issues, thereby increasing device yield).

FIG. 1 illustrates a cross-sectional view 100 of some embodiments of an integrated chip (IC) comprising a resistor 101 disposed over a substrate 102.

A first inter-metal dielectric (IMD) structure 104 overlies a substrate 102. A plurality of conductive wires 106 (e.g., metal wires) are disposed within the first IMD structure 104 and overlie the substrate 102. In some embodiments, an etch stop layer 108 is disposed over the first IMD structure 104 and the conductive wires 106. A second IMD structure 110 is disposed over the first IMD structure 104 and the conductive wires 106 (and the etch stop layer 108).

A resistor 101 (e.g., a thin film resistor (TFR)) is disposed over the second IMD structure 110. The resistor 101 comprises a resistive structure 112 and a pair of conductive contacts 114. In some embodiments, the resistive structure 112 may be or comprise, for example, silicon chromium (SiCr). However, other materials for the resistive structure 112 are amenable, for example, titanium nitride (TiN), nickel chromium (NiCr), nickel chromium aluminum (NiCrAl), tantalum nitride (TaN), some other restive material suitable for a TFR, or a combination of the foregoing. The resistive structure 112 is configured to reduce current flow between the conductive contacts 114.

The conductive contacts 114 are disposed over the resistive structure 112 and laterally spaced. For example, the resistor 101 comprises a first conductive contact 114a and a second conductive contact 114b that are disposed over the resistive structure 112 and laterally spaced from one another. The conductive contacts 114 are electrically coupled to the resistive structure 112. In some embodiments, the resistor 101 may, for example, be used in resistor-capacitor (RC) circuits, power drivers, power amplifiers, radio frequency (RF) applications, analog to digital converters (ADCs), digital to analog converters (DACs), or the like.

In some embodiments, the conductive contacts 114 may be or comprises, for example, titanium nitride (TiN), tantalum nitride (TaN), some other conductive material, or a combination of the foregoing. The conductive contacts 114 comprise a different material than the resistive structure 112 (e.g., the resistive structure 112 is SiC and the conductive contacts 114 are TiN). In further embodiments, the restive structure 112 has a thickness (e.g., a vertical distance between an upper surface of the resistive structure 112 and an underlying lower surface of the resistive structure 112) between about 30 angstroms (Å) and about 60 Å. In yet further embodiments, the thickness of the resistive structure 112 is about 50 Å.

In some embodiments, the second IMD structure 110 has a first upper surface and a second upper surface. The first upper surface of the second IMD structure 110 is disposed over the second upper surface of the second IMD structure 110. In other words, the first upper surface of the second IMD structure 110 is vertically spaced from the substrate 102 by a greater distance than the second upper surface of the second IMD structure 110. In some embodiments, the resistor 101 is disposed over (e.g., directly over) the first upper surface of the second IMD structure 110, as shown in the cross-sectional view 100 of FIG. 1.

Capping structures 116 are disposed over the conductive contacts 114 and the resistive structure 112. The capping structures 116 are disposed over (e.g., directly over) the conductive contacts 114, respectively. For example, a first capping structure 116a is disposed over (e.g., directly over) the first conductive contact 114a, and a second capping structure 116b is disposed over (e.g., directly over) the second conductive contact 114b. The capping structures 116 may be or comprise, for example, a nitride (e.g., silicon nitride (SiN)), an oxy-nitride (e.g., silicon oxy-nitride (SiON)), some other dielectric material, or a combination of the foregoing. In some embodiments, each of the capping structures 116 have a thickness between about 500 Å and about 1000 Å. In other embodiments, each of the capping structures 116 may have a thickness that is greater than about 1000 Å.

The capping structures 116 extend laterally over upper surfaces of the conductive contacts 114 and vertically along sidewalls of the conductive contacts 114, respectively. For example, the first capping structure 116a extends laterally along an upper surface of the first conductive contact 114a and vertically along an outer sidewall of the first conductive contact 114a. In some embodiments, the capping structures 116 extend vertically along the outer sidewalls of the conductive contacts 114, such that lower surfaces of the capping structures 116 are disposed below lower surfaces of the conductive contacts 114, respectively. For example, the first capping structure 116a extends vertically along the outer sidewall of the first conductive contact 114a, such that the first capping structure 116a has a lower surface that is disposed below a lower surface of the first conductive contact 114a. In some embodiments, the capping structures 116 contact (e.g., directly contact) the outer sidewalls of the conductive contacts 114, respectively. In further embodiments, the capping structures 116 contact (e.g., directly contact) the second upper surface of the second IMD structure 110.

A third IMD structure 118 is disposed over the second IMD structure 110, the resistor 101, and the capping structures 116. A first plurality of conductive vias 120 (e.g., metal vias) are disposed over the conductive contacts 114 and in the third IMD structure 118. The first plurality of conductive vias 120 extend vertically through the third IMD structure 118. Further, the first plurality of conductive vias 120 extend vertically through the capping structure 116 and are electrically coupled to the conductive contacts 114. For example, a first conductive via 120a is electrically coupled to the first conductive contact 114a and extends vertically through both the third IMD structure 118 and the first capping structure 116a, and a second conductive via 120b is electrically coupled to the second conductive contact 114b and extends vertically through both the third IMD structure 118 and the second capping structure 116b.

The capping structures 116 cover (e.g., completely cover) the upper surfaces and the outer sidewalls of the conductive contacts 114. For example, the first capping structure 116a covers the upper surface of the first conductive contact 114a and the outer sidewall of the first conductive contact 114a, and the second capping structure 116b covers an upper surface of the second conductive contact 114b and an outer sidewall of the second conductive contact 114b. Because the capping structures 116 cover the outer sidewalls of the conductive contacts 114, the conductive contacts 114 may be formed with larger footprints (e.g., upper surface areas) than if the capping structures 116 did not cover the outer sidewalls of the conductive contacts 114. Because the conductive contacts 114 have increased footprints, the area (e.g., landing zones) is increased in which the first plurality of conductive vias 120 must be formed on to be electrically coupled to the conductive contacts 114. Thus, the capping structures 116 may reduce the cost to form the IC (e.g., due to the larger footprints of the conductive contacts 114 decreasing misalignment issues, thereby increasing device yield).

Figure 2:
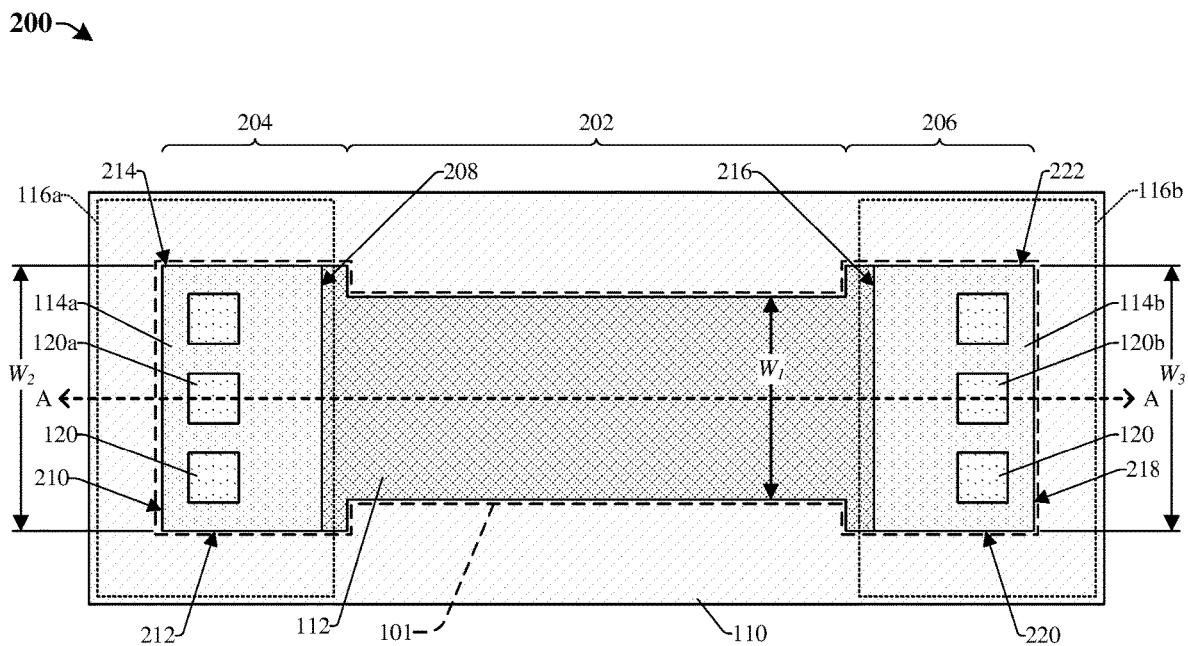
FIG. 2 illustrates a simplified top view of some embodiments of the IC of FIG. 1.

FIG. 2 illustrates a simplified top view 200 of some embodiments of the IC of FIG. 1. The simplified top view 200 of FIG. 2 is "simplified" because the third IMD structure 118 is omitted from the simplified top view 200 of FIG. 2. Further, for clarity, the capping structures 116 are illustrated in phantom (e.g., illustrated by dotted lines) in the simplified top view 200 of FIG. 2. The cross-sectional view 100 of FIG. 1 is taken along line A-A of FIG. 2.

As shown in the simplified top view 200 of FIG. 2, the resistive structure 112 comprises a central portion 202, a first peripheral portion 204, and a second peripheral portion 206. The central portion 202 of the resistive structure 112 has a first width $W_1$, the first peripheral portion 204 of the resistive structure 112 has a second width $W_2$, and the second peripheral portion 206 of the resistive structure 112 has a third width $W_3$. The first width $W_1$ is less than both the second width $W_2$ and the third width $W_3$. In some embodiments, the second width $W_2$ is substantially the same as the third width $W_3$, as shown in the simplified top view 200 of FIG. 2. In other embodiments, the second width $W_2$ may be different than the third width $W_3$. In some embodiments, the layout of the resistive structure 112 defines a layout of the resistor 101.

The first conductive contact 114a overlies the first peripheral portion 204 of the resistive structure 112. The first conductive contact 114a has a first sidewall 208, a second sidewall 210, a third sidewall 212, and a fourth sidewall 214. The first sidewall 208 of the first conductive contact 114a is opposite the second sidewall 210 of the first conductive contact 114a. The third sidewall 212 of the first conductive contact 114a is opposite the fourth sidewall 214 of the first conductive contact 114a. As shown in the simplified top view 200 of FIG. 2, in some embodiments, the second sidewall 210, the third sidewall 212, and the fourth sidewall 214 of the first conductive contact 114a are substantially aligned with corresponding sidewalls of the first peripheral portion 204 of the resistive structure 112.

The first capping structure 116a overlies the first conductive contact 114a. In some embodiments, besides the first plurality of conductive vias 120 that extend vertically through the first capping structure 116a, the first capping structure 116a covers (e.g., completely covers) an upper surface of the first conductive contact 114a. In further embodiments, the first capping structure 116a covers the first sidewall 208, the second sidewall 210, the third sidewall 212, and the fourth sidewall 214 of the first conductive contact 114a. In other words, the first capping structure 116a extends laterally over the second IMD structure 110 such that the first sidewall 208, the second sidewall 210, the third sidewall 212, and the fourth sidewall 214 of the first conductive contact 114a are disposed within an outer perimeter of the first capping structure 116a. In yet further embodiments, the first capping structure 116a may contact (e.g., directly contact) the second sidewall 210, the third sidewall 212, and/or the fourth sidewall 214 of the first conductive contact 114a. In other words, the first capping structure 116a may extend vertically along and contact (e.g., directly contact) the second sidewall 210, the third sidewall 212, and/or the fourth sidewall 214 of the first conductive contact 114a.

The second conductive contact 114b overlies the second peripheral portion 206 of the resistive structure 112. The second conductive contact 114b has a first sidewall 216, a second sidewall 218, a third sidewall 220, and a fourth sidewall 222. The first sidewall 216 of the second conductive contact 114b faces the first sidewall 208 of the first conductive contact 114a. The first sidewall 216 of the second conductive contact 114b is opposite the second sidewall 218 of the second conductive contact 114b. The third sidewall 220 of the second conductive contact 114b is opposite the fourth sidewall 222 of the second conductive contact 114b. As shown in the simplified top view 200 of FIG. 2, in some embodiments, the second sidewall 218, the third sidewall 220, and the fourth sidewall 222 of the second conductive contact 114b are substantially aligned with corresponding sidewalls of the second peripheral portion 206 of the resistive structure 112.

The second capping structure 116b overlies the second conductive contact 114b. In some embodiments, besides the first plurality of conductive vias 120 that extend vertically through the second capping structure 116b, the second capping structure 116b covers (e.g., completely covers) an upper surface of the second conductive contact 114b. In further embodiments, the second capping structure 116b covers the first sidewall 216, the second sidewall 218, the third sidewall 220, and the fourth sidewall 222 of the second conductive contact 114b. In other words, the second capping structure 116b extends laterally over the second IMD structure 110 such that the first sidewall 216, the second sidewall 218, the third sidewall 220, and the fourth sidewall 222 of the second conductive contact 114b are disposed within an outer perimeter of the second capping structure 116b. In yet further embodiments, the second capping structure 116b may contact (e.g., directly contact) the second sidewall 218, the third sidewall 220, and/or the fourth sidewall 222 of the second conductive contact 114b. In other words, the second capping structure 116b may extend vertically along and contact (e.g., directly contact) the second sidewall 218, the third sidewall 220, and/or the fourth sidewall 222 of the second conductive contact 114b.

Figure 3:
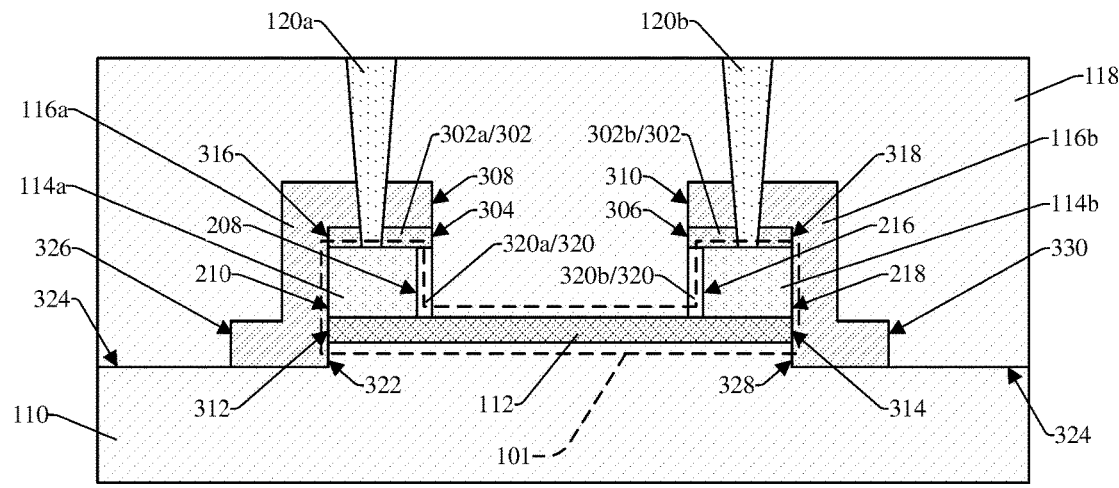
FIG. 3 illustrates a cross-sectional view of some other embodiments of the IC of FIG. 1.

FIG. 3 illustrates a cross-sectional view 300 of some other embodiments of the IC of FIG. 1.

As shown in the cross-sectional view 300 of FIG. 3, dielectric structures 302 are disposed over (e.g., directly over) the conductive contacts 114, respectively. For example, a first dielectric structure 302a is disposed over (e.g., directly over) the first conductive contact 114a, and a second dielectric structure 302b is disposed over (e.g., directly over) the second conductive contact 114b. The dielectric structures 302 vertically separate the capping structures 116 from the conductive contacts 114. For example, the first dielectric structure 302a vertically separates the first conductive contact 114a from the first capping structure 116a, and the second dielectric structure 302b vertically separates the second conductive contact 114b from the second capping structure 116b.

In some embodiments, the dielectric structures 302 may be or comprise, for example, a nitride (e.g., SiN), an oxy-nitride (e.g., SiON), some other dielectric material, or a combination of the foregoing. In further embodiments, the dielectric structures 302 are or comprise a different material than the capping structures 116 (e.g., the dielectric structures 302 are SiON and the capping structures 116 are SiN). In other embodiments, the dielectric structures 302 and the capping structures 116 are or comprise the same material (e.g., both the dielectric structures 302 and the capping structures 116 are SiON). In some embodiments, each of the dielectric structures 302 have a thickness between about 200 Å and about 500 Å. In other embodiments, each of the dielectric structures 302 may have a thickness that is greater than about 500 Å.

In some embodiments, first sidewalls of the dielectric structures 302 are disposed between the first sidewalls of the conductive contacts 114. For example, a first sidewall 304 of the first dielectric structure 302a and a first sidewall 306 of the second dielectric structure 302b are disposed laterally between the first sidewall 208 of the first conductive contact 114a and the first sidewall 216 of the second conductive contact 114b. The first sidewall 304 of the first dielectric structure 302a faces the first sidewall 306 of the second dielectric structure 302b.

In some embodiments, the first sidewalls of the dielectric structure 302 are aligned with first sidewalls of the capping structures 116, respectively. For example, the first sidewall 304 of the first dielectric structure 302a is aligned with a first sidewall 308 of the first capping structure 116a, and the first sidewall 306 of the second dielectric structure 302b is aligned with a first sidewall 310 of the second capping structure 116b. The first sidewall 308 of the first capping structure 116a faces the first sidewall 310 of the second capping structure 116b. In some embodiments, the first sidewall 208 of the first conductive contact 114a and the first sidewall 216 of the second conductive contact 114b are laterally spaced apart a greater distance than the first sidewall 308 of the first capping structure 116a and the first sidewall 310 of the second capping structure 116b, as shown in the cross-sectional view 300 of FIG. 3.

The first sidewall 208 of the first conductive contact 114a, the first sidewall 216 of the second conductive contact 114b, the first sidewall 304 of the first dielectric structure 302a, the first sidewall 306 of the second dielectric structure 302b, the first sidewall 308 of the first capping structure 116a, and the first sidewall 310 of the second capping structure 116b are disposed laterally between a first sidewall 312 of the resistive structure 112 and a second sidewall 314 of the resistive structure 112. In some embodiments, the first sidewall 208 of the first conductive contact 114a is disposed laterally between the first sidewall 308 of the first capping structure 116a and the first sidewall 312 of the resistive structure 112. In further embodiments, the first sidewall 216 of the second conductive contact 114b is disposed laterally between the first sidewall 310 of the second capping structure 116b and the second sidewall 314 of the resistive structure 112.

In some embodiments, second sidewalls of the dielectric structures 302 are aligned with the second sidewalls of the conductive contacts 114, respectively. For example, a second sidewall 316 of the first dielectric structure 302a is aligned with the second sidewall 210 of the first conductive contact 114a, and a second sidewall 318 of the second dielectric structure 302b is aligned with the second sidewall 218 of the second conductive contact 114b. The second sidewall 316 of the first dielectric structure 302a is opposite the first sidewall 304 of the first dielectric structure 302a. The second sidewall 318 of the second dielectric structure 302b is opposite the first sidewall 306 of the second dielectric structure 302b. The second sidewall 316 of the first dielectric structure 302a and/or the second sidewall 210 of the first conductive contact 114a may be aligned with the first sidewall 312 of the resistive structure 112. The second sidewall 318 of the second dielectric structure 302b and/or the second sidewall 218 of the second conductive contact 114b may be substantially aligned with the second sidewall 314 of the resistive structure 112.

In some embodiments, cavities 320 are disposed along the first sidewalls of the conductive contacts 114, respectively. For example, a first cavity 320a is disposed along the first sidewall 208 of the first conductive contact 114a and below the first dielectric structure 302a, and a second cavity 320b is disposed along the first sidewall 216 of the second conductive contact 114b and below the second dielectric structure 302b. The first capping structure 116a overlies the first cavity 320a. The second capping structure 116b overlies the second cavity 320b. In some embodiments, the first cavity 320a extends from the third sidewall 212 of the first conductive contact 114a to the fourth sidewall 214 of the first conductive contact 114a (see, e.g., FIG. 2). In further embodiments, the second cavity 320b extends from the third sidewall 220 of the second conductive contact 114b to the fourth sidewall 222 of the second conductive contact 114b (see, e.g., FIG. 2). In yet further embodiments, each of the cavities 320 may have a width (e.g., a lateral distance from the first sidewall 208 of the first conductive contact 114a to a nearest sidewall of the third IMD structure 118) between about 1500 nanometers (nm) and about 2200 nm.

The first capping structure 116a extends vertically along the second sidewall 316 of the first dielectric structure 302a, the second sidewall 210 of the first conductive contact 114a, and the first sidewall 312 of the resistive structure 112. In some embodiments, the first capping structure 116a also extends vertically along a first sidewall 322 of the second IMD structure 110. In further embodiments, the first capping structure 116a extends vertically along the second sidewall 316 of the first dielectric structure 302a, the second sidewall 210 of the first conductive contact 114a, the first sidewall 312 of the resistive structure 112, and the first sidewall 322 of the second IMD structure 110 to contact an upper surface 324 of the second IMD structure 110.

In some embodiments, a bottom surface of the first capping structure 116a is disposed below a bottom surface of the resistive structure 112. The bottom surface of the first capping structure 116a may engage the upper surface 324 of the second IMD structure 110, as shown in the cross-sectional view 300 of FIG. 3. In further embodiments, the first capping structure 116a contacts (e.g., directly contacts) the first dielectric structure 302a, the first conductive contact 114a, the resistive structure 112, and the second IMD structure 110. More specifically, in some embodiments, the first capping structure 116a contacts (e.g., directly contacts) an upper surface of the first dielectric structure 302a, the second sidewall 316 of the first dielectric structure 302a, the second sidewall 210 of the first conductive contact 114a, the first sidewall 312 of the resistive structure 112, the first sidewall 322 of the second IMD structure 110, and the upper surface 324 of the second IMD structure 110. The first capping structure 116a extends laterally from the first sidewall 312 of the resistive structure 112 to a second sidewall 326 of the first capping structure 116a. In some embodiments, the first capping structure 116a extends laterally from the first sidewall 312 of the resistive structure 112 to the second sidewall 326 of the first capping structure 116a along the upper surface 324 of the second IMD structure 110.

The second capping structure 116b extends vertically along the second sidewall 318 of the second dielectric structure 302b, the second sidewall 218 of the second conductive contact 114b, and the second sidewall 314 of the resistive structure 112. In some embodiments, the second capping structure 116b also extends vertically along a second sidewall 328 of the second IMD structure 110. In further embodiments, the second capping structure 116b extends vertically along the second sidewall 318 of the second dielectric structure 302b, the second sidewall 218 of the second conductive contact 114b, the second sidewall 314 of the resistive structure 112, and the second sidewall 328 of the second IMD structure 110 to contact the upper surface 324 of the second IMD structure 110.

In some embodiments, a bottom surface of the second capping structure 116b is disposed below the bottom surface of the resistive structure 112. The bottom surface of the second capping structure 116b may engage the upper surface 324 of the second IMD structure 110, as shown in the cross-sectional view 300 of FIG. 3. In further embodiments, the bottom surface of the second capping structure 116b and the bottom surface of the first capping structure 116a are aligned (e.g., co-planar). In other embodiments, the bottom surface of the second capping structure 116b is disposed over or below the bottom surface of the first capping structure 116a.

In some embodiments, the second capping structure 116b contacts (e.g., directly contacts) the second dielectric structure 302b, the second conductive contact 114b, the resistive structure 112, and the second IMD structure 110. More specifically, in some embodiments, the second capping structure 116b contacts (e.g., directly contacts) an upper surface of the second dielectric structure 302b, the second sidewall 318 of the second dielectric structure 302b, the second sidewall 218 of the second conductive contact 114b, the second sidewall 314 of the resistive structure 112, the second sidewall 328 of the second IMD structure 110, and the upper surface 324 of the second IMD structure 110. The second capping structure 116b extends laterally from the second sidewall 314 of the resistive structure 112 to a second sidewall 330 of the second capping structure 116b. In some embodiments, the second capping structure 116b extends laterally from the second sidewall 314 of the resistive structure 112 to the second sidewall 330 of the second capping structure 116b along the upper surface 324 of the second IMD structure 110.

A portion of the third IMD structure 118 is disposed between (e.g., directly between) the first conductive contact 114a and the second conductive contact 114b. The portion of the third IMD structure 118 is disposed over (e.g., directly over) the resistive structure 112, laterally between the first conductive contact 114a and the second conductive contact 114b, and below an upper surface of the first conductive contact 114a and an upper surface of the second conductive contact 114b. The portion of the third IMD structure 118 is also disposed between (e.g., directly between) the cavities 320.

Figure 4:
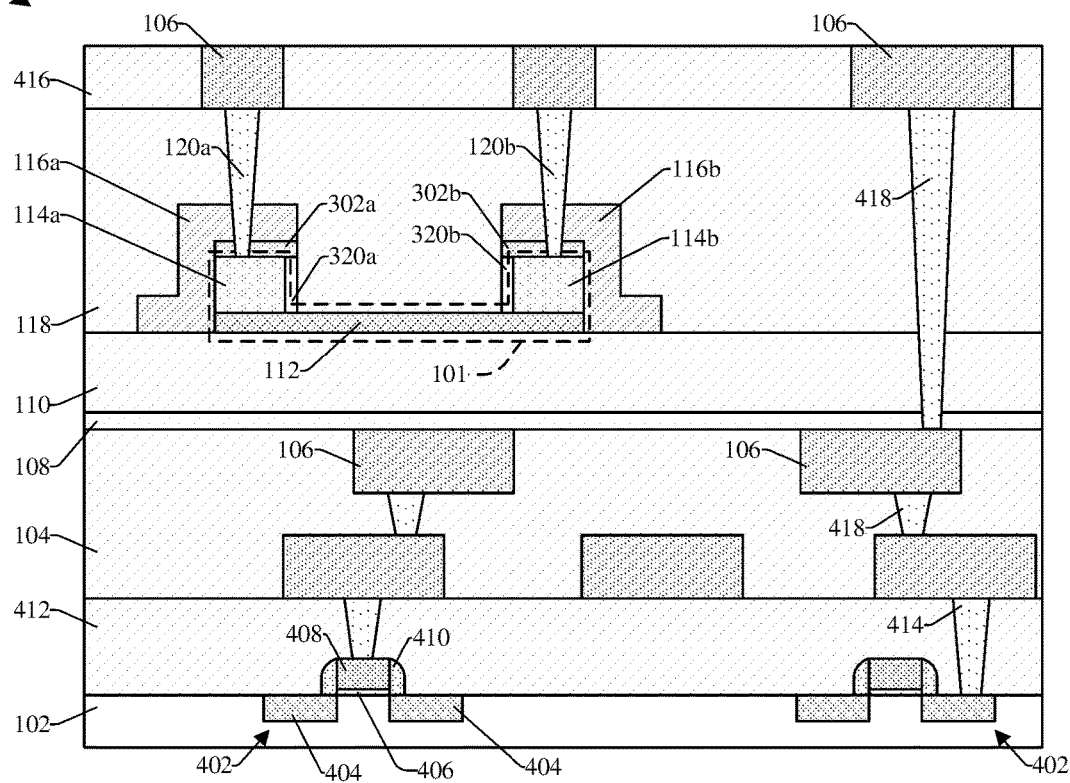
FIG. 4 illustrates a cross-sectional view of some other embodiments of the IC of FIG. 1.

FIG. 4 illustrates a cross-sectional view 400 of some other embodiments of the IC of FIG. 1.

As shown in the cross-sectional view 400 of FIG. 4, one or more semiconductor devices 402 (e.g., insulated gate field-effect transistors (IGFETs)) are disposed within/over the substrate 102. The substrate 102 comprises any type of semiconductor body (e.g., monocrystalline silicon/CMOS bulk, germanium (Ge), silicon-germanium (SiGe), gallium arsenide (GaAs), silicon on insulator (SOI), etc.). In some embodiments, the semiconductor devices 402 each comprise source/drain regions 404, a gate dielectric layer 406, a gate electrode 408, and a sidewall spacer 410. The gate dielectric layer 406 overlies the substrate 102, and the gate electrode 408 overlies the gate dielectric layer 406. In some embodiments, the gate electrode 408 comprises polysilicon. In such embodiments, the gate dielectric layer 406 may comprise or be, for example, an oxide (e.g., $SiO_2$). In other embodiments, the gate electrode 408 may be or comprise a metal, such as aluminum (Al), copper (Cu), titanium (Ti), tantalum (Ta), tungsten (W), molybdenum (Mo), cobalt (Co), or the like. In such embodiments, the gate dielectric layer 406 may be or comprise a high-k dielectric material, such as hafnium oxide (HfO), tantalum oxide (TaO), hafnium silicon oxide (HfSiO), hafnium tantalum oxide (HMO), aluminum oxide (AlO), zirconium oxide (ZrO), or the like.

The source/drain regions 404 are disposed in the substrate 102 on opposite sides of the gate electrode 408. The source/drain regions 404 are doped regions of the substrate 102. The sidewall spacer 410 overlies the substrate and laterally surrounds the gate electrode 408. The sidewall spacer 410 may be or comprise, for example, a nitride (e.g., SiN), an oxy-nitride (e.g., SiON), an oxide (e.g., $SiO_2$), some other dielectric material, or a combination of the foregoing.

An interlayer dielectric (ILD) structure 412 is disposed over the substrate 102 and the semiconductor devices 402. The ILD structure 412 comprises one or more stacked ILD layers, which may respectively comprise a low-k dielectric (e.g., a dielectric material with a dielectric constant less than about 3.9), an oxide (e.g., $SiO_2$), an oxy-nitride (e.g., SiON), doped silicon dioxide (e.g., carbon doped silicon dioxide), borosilicate glass (BSG), phosphoric silicate glass (PSG), borophosphosilicate glass (BPSG), fluorinated silicate glass (FSG), or the like. A plurality of conductive contacts 414 are disposed over the substrate 102 and embedded in the ILD structure 412. The plurality of conductive contacts 414 may be or comprise, for example, tungsten (W), copper (Cu), aluminum (Al), some other conductive material, or a combination of the foregoing. The plurality of conductive contacts 414 extend vertically through the ILD structure 412 and are electrically coupled to the semiconductor devices 402 and/or the substrate 102.

The first IMD structure 104 is disposed over the ILD structure 412. The second IMD structure 110 is disposed over the first IMD structure 104. The third IMD structure 118 is disposed over the second IMD structure 110. A fourth IMD structure 416 is disposed over the third IMD structure 118. The first IMD structure 104, the second IMD structure 110, the third IMD structure 118, and the fourth IMD structure 416 each comprise one or more stacked IMD layers, which may respectively comprise a low-k dielectric (e.g., a dielectric material with a dielectric constant less than about 3.9), an oxide (e.g., $SiO_2$), an oxy-nitride (e.g., SiON), doped silicon dioxide (e.g., carbon doped silicon dioxide), borosilicate glass (BSG), phosphoric silicate glass (PSG), borophosphosilicate glass (BPSG), fluorinated silicate glass (FSG), or the like.

In some embodiments, the etch stop layer 108 is disposed between the first IMD structure 104 and the second IMD structure 110. In other embodiments, the etch stop layer 108 is omitted. The etch stop layer 108 may be or comprise, for example, a nitride (e.g., SiN), an oxy-nitride (e.g., SiON), or the like.

The resistor 101, the dielectric structures 302, and the capping structures 116 are disposed over the semiconductor devices 402 and the substrate 102. In some embodiments, the resistor 101, the dielectric structures 302, and the capping structures 116 are disposed over the etch stop layer 108. The third IMD structure 118 is disposed over the resistor 101, the dielectric structures 302, and the capping structures 116.

The plurality of conductive wires 106 are disposed in one or more of the IMD structures. For example, one or more of the plurality of conductive wires 106 are disposed in the first IMD structure 104 and the fourth IMD structure 416, as shown in the cross-sectional view 400 of FIG. 4. While not shown in the cross-sectional view 400 of FIG. 4, it will be appreciated that one or more of the plurality of conductive wires 106 may be disposed in the second IMD structure 110 and/or the third IMD structure 118. The plurality of conductive wires 106 may be or comprise, for example, copper (Cu), aluminum (Al), gold (Au), silver (Ag), some other conductive material, or a combination of the foregoing.

A second plurality of conductive vias 418 are disposed in one or more of the IMD structures. For example, one or more of the second plurality of conductive vias 418 are disposed in the first IMD structure 104, the second IMD structure 110, and the third IMD structure 118. In some embodiments, one or more of the second plurality of conductive vias 418 may also be disposed in the etch stop layer 108. In further embodiments, one or more of the second plurality of conductive vias 418 extend vertically through two or more of the IMD structures. For example, one or more of the second plurality of conductive vias 418 may extend vertically through the etch stop layer 108, the second IMD structure 110, and the third IMD structure 118. The first plurality of conductive vias 120 and the second plurality of conductive vias 418 may be or comprise, for example, copper (Cu), aluminum (Al), gold (Au), silver (Ag), some other conductive material, or a combination of the foregoing.

The plurality of conductive contacts 414, the plurality of conductive wires 106, the second plurality of conductive vias 418, the first plurality of conductive vias 120, the ILD structure 412, the first IMD structure 104, the etch stop layer 108, the second IMD structure 110, the third IMD structure 118, and the fourth IMD structure 416 are part of an interconnect structure. The interconnect structure is disposed over the substrate 102 and is configured to electrically couple the devices (e.g., the resistor 101, the semiconductor device 402, etc.) that are disposed over/within the substrate 102 together in a predefined manner. While not shown in the cross-sectional view 400 of FIG. 4, it will be appreciated that the interconnect structure may comprise any number of other conductive features (e.g., conductive lines and conductive vias) and or dielectric structures (e.g., additional ILD/IMD structures).

Figure 5A:
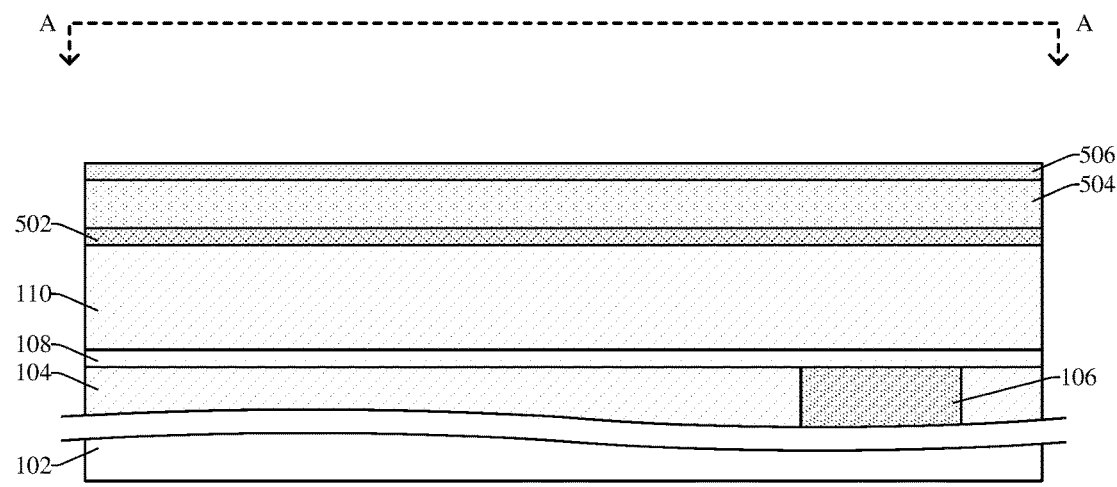
FIGS. 5A-5B through 10A-10B illustrate a series of various views of some embodiments of a method for forming an IC comprising a resistor disposed over a substrate.
Figure 5B:
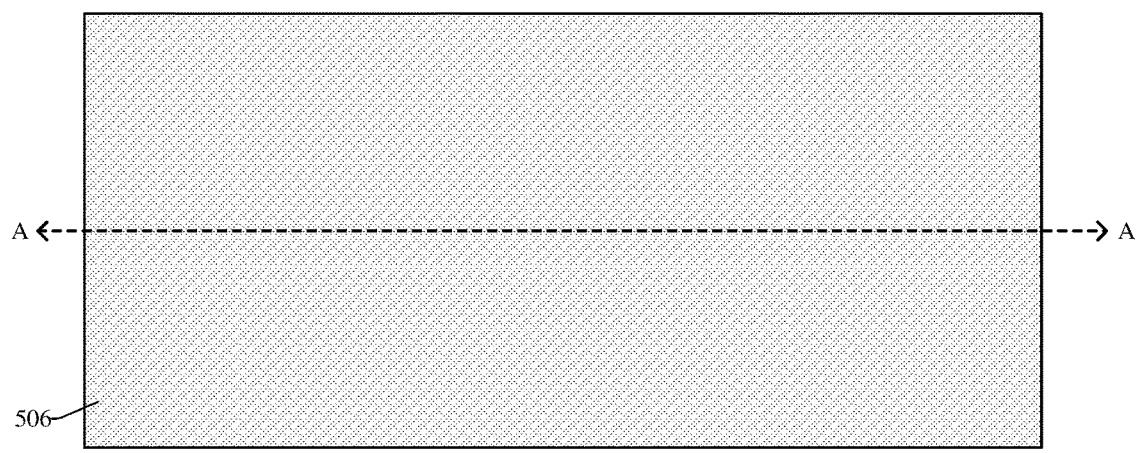

FIGS. 5A-5B through 10A-10B illustrate a series of various views of some embodiments of a method for forming an IC comprising a resistor 101 disposed over a substrate 102. Figures with a suffix of "A" (e.g., FIG. 5A) illustrate a series of cross-sectional views 500a-1000a of some embodiments for forming the IC comprising the resistor 101 disposed over the substrate 102. Figures with the suffix "B" (e.g., FIG. 5B) illustrate a series of top views 500b-1000b taken along line A-A of corresponding figures of FIGS. 5A-10A (e.g., FIG. 5B illustrates a top view 500b of the structure of FIG. 5A taken along line A-A of FIG. 5A). Although FIGS. 5A-5B through 10A-10B are described with reference to a method, it will be appreciated that the structures shown in FIGS. 5A-5B through 10A-10B are not limited to the method but rather may stand alone separate of the method.

As shown in cross-sectional view 500a of FIG. 5A and top view 500b of FIG. 5B, a substrate 102 is provided and a first inter-metal dielectric (IMD) structure 104 is formed over the substrate 102. The first IMD structure 104 may be formed by, for example, chemical vapor deposition (CVD), physical vapor deposition (PVD), atomic layer deposition (ALD), some other deposition process, or a combination of the foregoing. Thereafter, a plurality of conductive wires 106 are formed over the substrate 102 and within the first IMD structure 104. In some embodiments, the plurality of conductive wires 106 may be formed by, for example, a dual damascene process or a single damascene process. In further embodiments, the plurality of conductive wires 106 may be formed by, for example, CVD, PVD, ALD, sputtering, electrochemical plating, electroless plating, some other deposition process, or a combination of the foregoing.

In some embodiments, an etch stop layer 108 is then formed over the first IMD structure 104. The etch stop layer 108 may be formed by, for example, CVD, PVD, ALD, some other deposition process, or a combination of the foregoing. A second IMD structure 110 is then formed over the first IMD structure 104 (and the etch stop layer 108). The second IMD structure 110 may be formed by, for example, CVD, PVD, ALD, some other deposition process, or a combination of the foregoing.

Also shown in the cross-sectional view 500a of FIG. 5A and the top view 500b of FIG. 5B, a resistive layer 502 is formed over the substrate 102 and the second IMD structure 110. The resistive layer 502 may be or comprise, for example, silicon chromium (SiCr). However, other materials for the resistive layer 502 are amenable. In some embodiments, the resistive layer 502 is formed with a thickness between about 30 angstroms (Å) and about 60 Å. In further embodiments, the resistive layer 502 is formed with a thickness of about 50 Å. It will be appreciated that the resistive layer 502 may be formed with other thicknesses. In some embodiments, a process for forming the resistive layer 502 comprises depositing the resistive layer 502 on the second IMD structure 110. The resistive layer 502 may be deposited by, for example, CVD, PVD, ALD, sputtering, some other deposition process, or a combination of the foregoing.

A conductive layer 504 is then formed over the resistive layer 502. The conductive layer 504 may be or comprise, for example, titanium nitride (TiN), tantalum nitride (TaN), some other conductive material, or a combination of the foregoing. The conductive layer 504 comprise a different material than the resistive layer 502 (e.g., the resistive layer 502 is SiC and the conductive layer 504 is TiN). In some embodiments, a process for forming the conductive layer 504 comprises depositing the conductive layer 504 on the resistive layer 502. The conductive layer 504 may be deposited by, for example, CVD, PVD, ALD, sputtering, electrochemical plating, electroless plating, some other deposition process, or a combination of the foregoing.

Thereafter, a dielectric layer 506 is formed over the conductive layer 504. The dielectric layer 506 may be or comprise, for example, a nitride (e.g., SiN), an oxy-nitride (e.g., SiON), some other dielectric material, or a combination of the foregoing. In some embodiments, the dielectric layer 506 is formed with a thickness between about 200 Å and about 500 Å. In other embodiments, the dielectric layer 506 is formed with a thickness that is greater than about 500 Å. In some embodiments, a process for forming the dielectric layer 506 comprises depositing or growing the dielectric layer 506 on the conductive layer 504. The dielectric layer 506 may be deposited by, for example, CVD, PVD, ALD, thermal oxidation, some other deposition or growth process, or a combination of the foregoing.

Figure 6A:
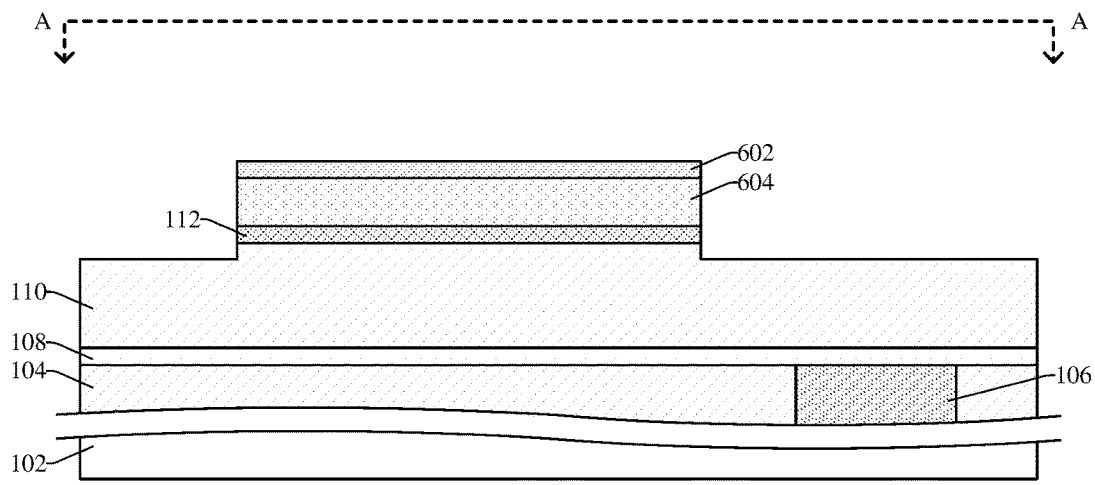
Figure 6B:
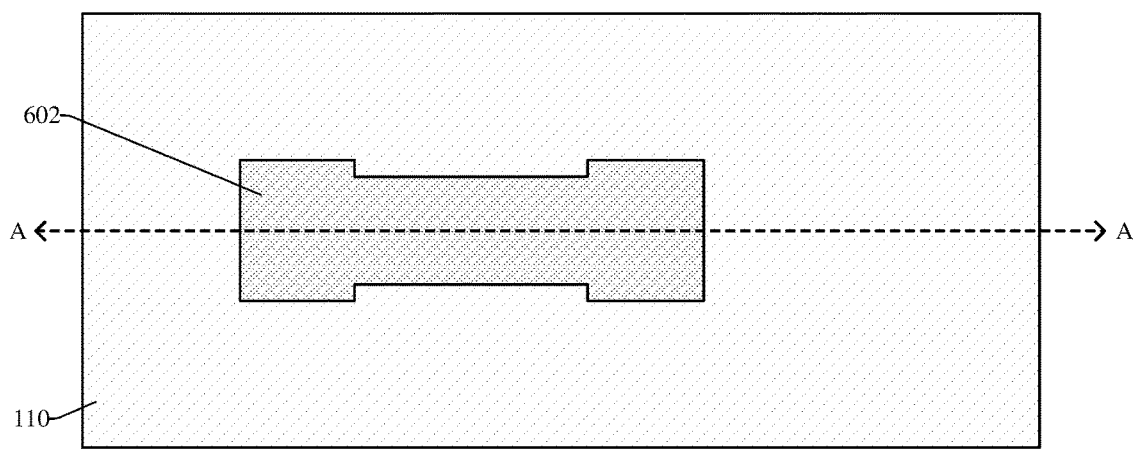

As shown in cross-sectional view 600*a* of FIG. 6A and top view 600*b* of FIG. 6B, a first patterning process is performed on the dielectric layer 506 (see, FIG. 5), the conductive layer 504 (see, FIG. 5), and the resistive layer 502 (see, FIG. 5) to form a dielectric structure 602, a first conductive structure 604, and a resistive structure 112, respectively. In some embodiments, the first patterning process comprises forming a patterned masking layer (not shown) (e.g., positive/negative photoresist, a hardmask, etc.) over the dielectric layer 506. The patterned masking layer may be formed by forming a masking layer (not shown) on the dielectric layer 506 (e.g., via a spin-on process), exposing the masking layer to a pattern (e.g., via a lithography process, such as photolithography, extreme ultraviolet lithography, or the like), and developing the masking layer, thereby forming the patterned masking layer over the dielectric layer 506. Thereafter, with the patterned masking layer in place, an etching process is performed on the dielectric layer 506, the conductive layer 504, and the resistive layer 502 to selectively etch the dielectric layer 506, the conductive layer 504, and the resistive layer 502 according to the patterned masking layer. The etching process removes unmasked portions of the dielectric layer 506, the conductive layer 504, and the resistive layer 502, thereby forming the dielectric structure 602, the first conductive structure 604, and the resistive structure 112, respectively. In some embodiments, the etching process may be, for example, a dry etching process, a reactive ion etching (RIE) process, a wet etching process, some other etching process, or a combination of the foregoing. In further embodiments, the patterned masking layer is subsequently stripped away.

Figure 7A:
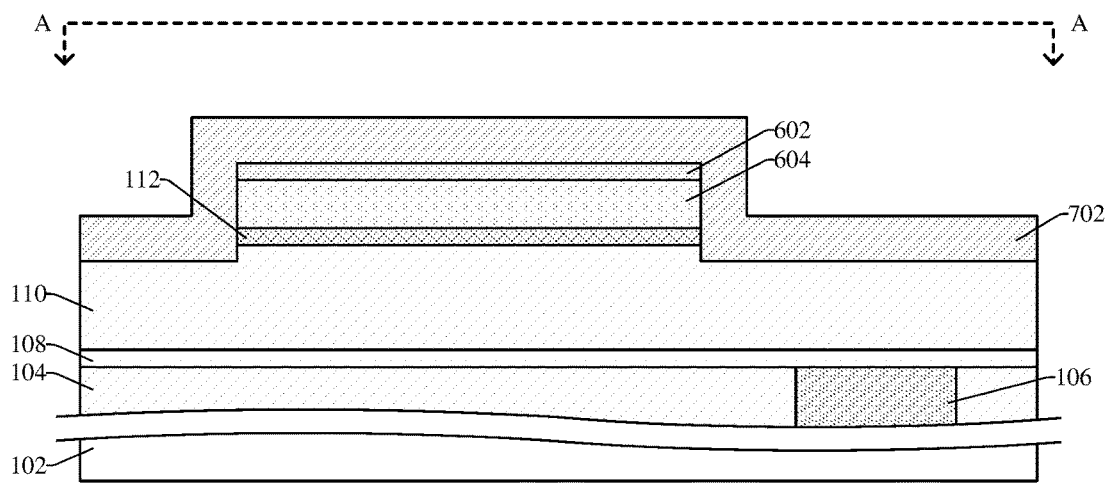
Figure 7B:
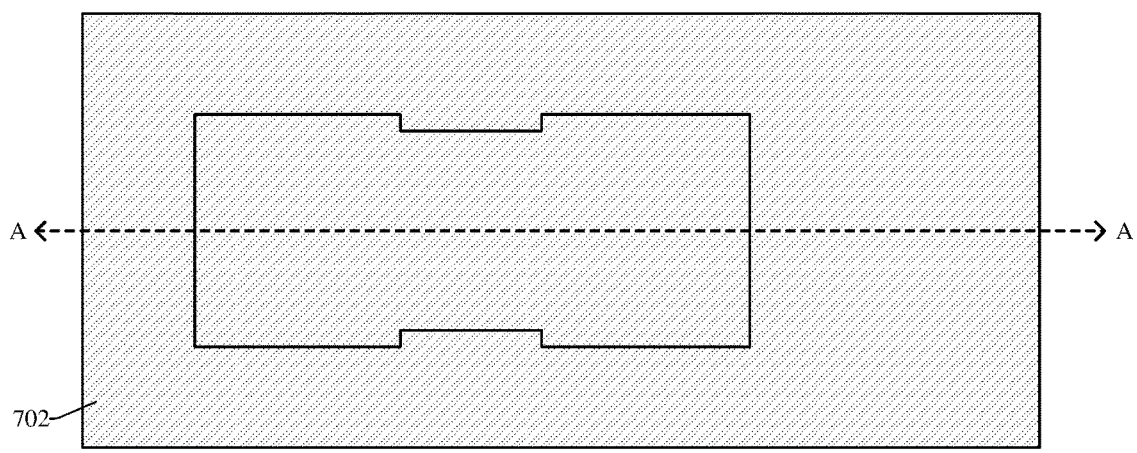

As shown in cross-sectional view 700*a* of FIG. 7A and top view 700*b* of FIG. 7B, a capping layer 702 is formed over the dielectric structure 602, the first conductive structure 604, the resistive structure 112, and the second IMD structure 110. In some embodiments, the capping layer 702 is formed on (e.g., directly on) the dielectric structure 602, the first conductive structure 604, the resistive structure 112, and the second IMD structure 110. The capping layer 702 covers (e.g., completely covers) the dielectric structure 602, the first conductive structure 604, and the resistive structure 112. The capping layer 702 is formed extending over an upper surface of the dielectric structure 602 and along sidewalls of the dielectric structure 602, the first conductive structure 604, the resistive structure 112, and the second IMD structure 110. Thus, the capping layer 702 covers the upper surface of the dielectric structure 602 and the sidewalls of the dielectric structure 602, the first conductive structure 604, the resistive structure 112, and the second IMD structure 110.

In some embodiments, the capping layer 702 is formed via a deposition process. The deposition process may be, for example, CVD, PVD, ALD, some other deposition process, or a combination of the foregoing. In further embodiments, the capping layer 702 is formed as a conformal layer.

The capping layer 702 may be or comprise, for example, a nitride (e.g., silicon nitride (SiN)), an oxy-nitride (e.g., silicon oxy-nitride (SiON)), some other dielectric material, or a combination of the foregoing. In some embodiments, the capping layer 702 has a thickness between about 500 Å and about 1000 Å. In other embodiments, the capping layer 702 may have a thickness that is greater than about 1000 Å. In some embodiments, the capping layer 702 is or comprises a different material than the dielectric structure 602 (e.g., the capping layer 702 is SiN and the dielectric structure 602 is SiON). In other embodiments, the capping layer 702 and the dielectric structure 602 comprise a same material (e.g., both the capping layer 702 and the dielectric structure 602 are SiON).

Figure 8A:
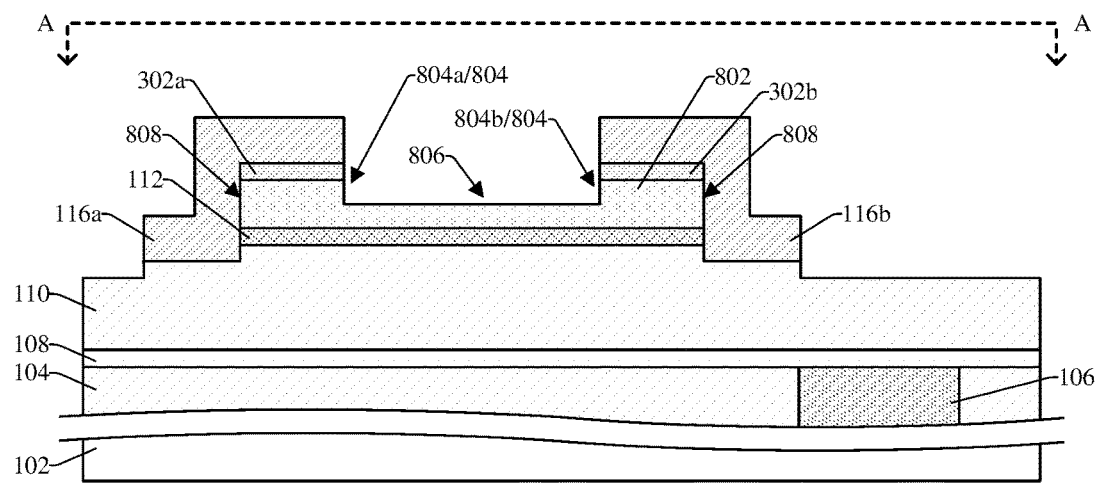
Figure 8B:
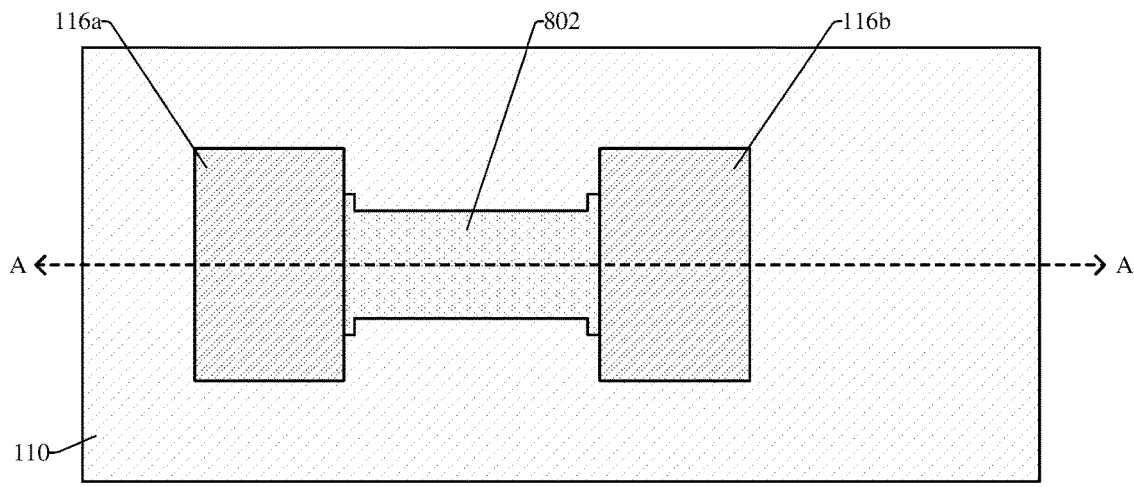

As shown in cross-sectional view 800*a* of FIG. 8A and top view 800*b* of FIG. 8B, a second patterning process is performed on the capping layer 702 (see, FIG. 7), the dielectric structure 602 (see, FIG. 7), and the first conductive structure 604 (see, FIG. 7) to form capping structures 116, dielectric structures 302, and a second conductive structure 802. More specifically, the capping layer 702 is patterned to form a first capping structure 116*a* and a second capping structure 116*b*, the dielectric structure 602 is patterned to form a first dielectric structure 302*a* and a second dielectric structure 302*b*, and the first conductive structure 604 is patterned to form the second conductive structure 802.

The capping structures 116 overlie the dielectric structures 302, respectively. The dielectric structures 302 overlie peripheral portions 804 of the second conductive structure 802, respectively. For example, the first dielectric structure 302*a* overlies a first peripheral portion 804*a* of the second conductive structure 802, and the second dielectric structure 302*b* overlies a second peripheral portion 804*b* of the second conductive structure 802. The first peripheral portion 804*a* of the second conductive structure 802 and the second peripheral portion 804*b* of the second conductive structure 802 are laterally separated by a central portion 806 of the second conductive structure 802.

The capping structures 116 cover upper surfaces of the peripheral portions 804 of the second conductive structure 802, respectively. For example, the first capping structure 116*a* covers an upper surface of the first peripheral portion 804*a* of the second conductive structure 802, and the second capping structure 116*b* covers an upper surface of the second peripheral portion 804*b* of the second conductive structure 802. In some embodiments, the capping structures 116 cover upper surfaces of the dielectric structures 302, respectively. For example, the first capping structure 116*a* covers an upper surface of the first dielectric structure 302*a*, and the second capping structure 116*b* covers an upper surface of the second dielectric structure 302*b*.

The capping structures 116 also cover sidewalls of dielectric structure 302. Further, the capping structures 116 cover sidewalls 808 of the second conductive structure 802. In some embodiments, the capping structures 116 cover sidewalls of the resistive structure 112. In further embodiments, the capping structures 116 cover the sidewalls of the second IMD structure 110 and the upper surface of the second IMD structure 110.

In some embodiments, the second patterning process comprises forming a patterned masking layer (not shown) (e.g., positive/negative photoresist, a hardmask, etc.) over the capping layer 702. The patterned masking layer may be formed by forming a masking layer (not shown) on the capping layer 702 (e.g., via a spin-on process), exposing the masking layer to a pattern (e.g., via a lithography process, such as photolithography, extreme ultraviolet lithography, or the like), and developing the masking layer, thereby forming the patterned masking layer over the capping layer 702. Thereafter, with the patterned masking layer in place, a first etching process is performed on the capping layer 702, the dielectric structure 602, and the first conductive structure 604 to selectively etch the capping layer 702, the dielectric structure 602, and the first conductive structure 604 according to the patterned masking layer. The first etching process removes unmasked portions of the capping layer 702 and unmasked portions of the dielectric structure 602, thereby forming the capping structures 116, forming the dielectric structures 302, and exposing the first conductive structure 604.

In some embodiments, the first etching process also removes an upper section of an unmasked portion of the first conductive structure 604, thereby forming the second conductive structure 802. In other embodiments, the first etching process may stop on the first conductive structure 604 (e.g., not remove a substantial portion of the first conductive structure 604) and expose an upper surface of the first conductive structure 604. In some embodiments, the first etching process also removes upper sections of unmasked portions of the second IMD structure 110, as shown in the cross-sectional view 800a of FIG. 8A and the top view 800b of FIG. 8B.

The first etching process may be, for example, dry etching process, a RIE process, a wet etching process, some other etching process, or a combination of the foregoing. More specifically, in some embodiments, the first etching process is a dry etching process that anisotropically etches the capping layer 702 and the dielectric structure 602 (and the first conductive structure 604). The first etching process is stopped before the first etching process etches through (e.g., completely through) the first conductive structure 604 to prevent over etching of the resistive structure 112. For example, the resistive structure 112 is relatively thin (e.g., less than or equal to about 50 Å), and the first etching process will etch the resistive structure 112 at least at the same rate as the first etching process etches the first conductive structure 604. Thus, if the first etching process is performed for too long, the first etching process may undesirably remove a portion of the resistive structure 112, thereby damaging the resistive structure 112 (e.g., complete or partial removal of a portion of the resistive structure 112). Accordingly, the first etching process is stopped before the first conductive structure 604 is etched through (e.g., completely through). In some embodiments, the patterned masking layer may be subsequently stripped away.

Figure 9A:
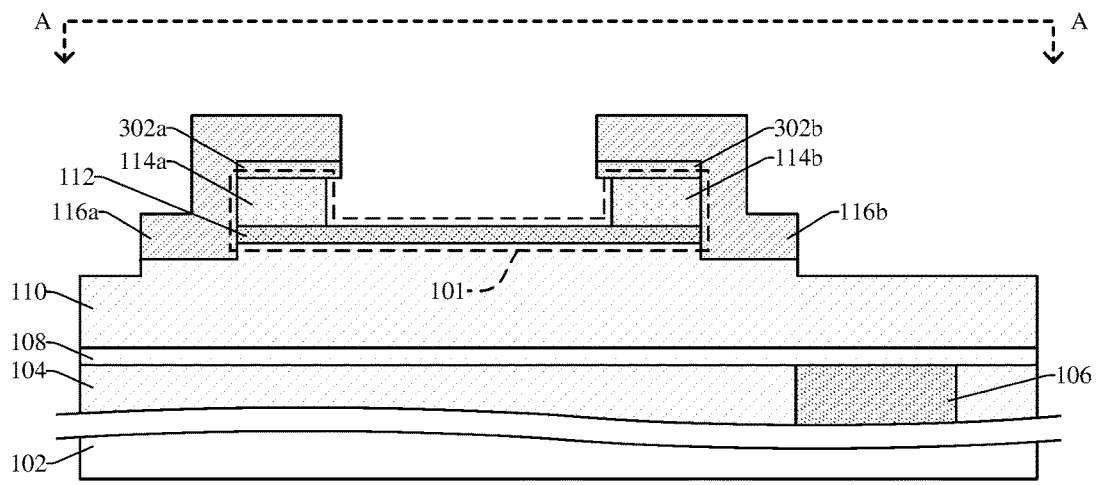
Figure 9B:
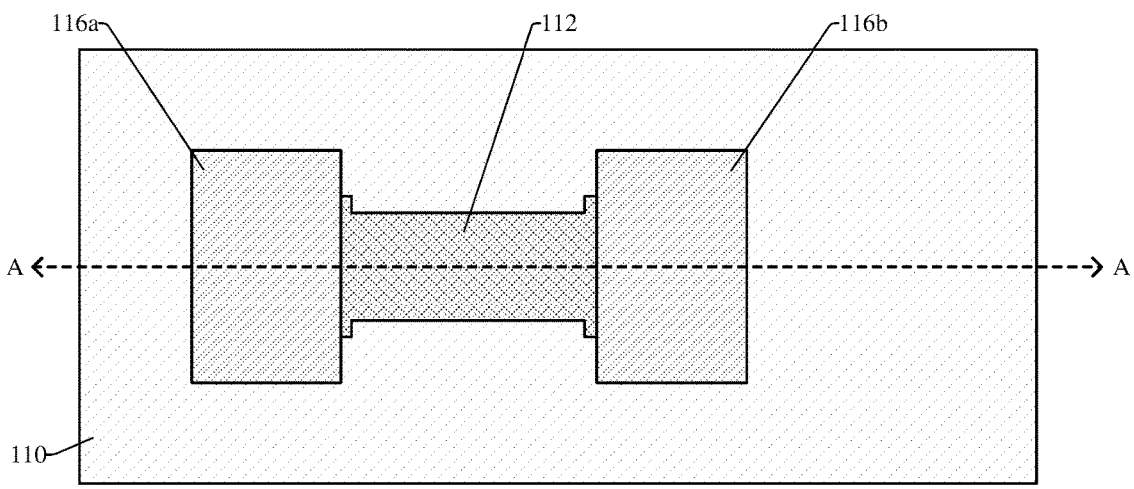

As shown in cross-sectional view 900a of FIG. 9A and top view 900b of FIG. 9B, a third patterning process is performed on the second conductive structure 802 to form conductive contacts 114 over the resistive structure 112. The third patterning process comprises performing a second etching process on the second conductive structure 802. The second etching process may be, for example, a wet etching process, a dry etching process, a RIE process, some other etching process, or a combination of the foregoing. More specifically, in some embodiments, the first etching process is a wet etching process that utilizes hydrogen peroxide ($H_2O_2$) as an etchant (e.g., $H_2O_2$ etch). In further embodiments, the wet etching process is an isotropic etching process. In some embodiments, formation of the resistor 101 is complete after the third patterning process is complete.

The second etching process removes unmasked portions of the second conductive structure 802, thereby forming the conductive contacts 114. For example, the second etching process removes the central portion 806 of the second conductive structure 802, thereby forming a first conductive contact 114a and a second conductive contact 114b. The etchants (e.g., $H_2O_2$) of the second etching process have a higher etch selectively for the second conductive structure 802 than the resistive structure 112. In other words, the second etching process etches the second conductive structure 802 at a faster rate (e.g., a much faster rate) than the resistive structure 112. Thus, the second etching process can be selectively stopped on the resistive structure 112 (e.g., the resistive structure 112 acts and an etch stop), thereby preventing damage to the resistive structure 112 (e.g., preventing over etching of the resistive structure 112).

The second etching process also has a higher etch selectively for the second conductive structure 802 than the dielectric structures 302 and the capping structures 116. Thus, the second etching process laterally etches the second conductive structure 802 from the central portion 806 of the second conductive structure 802 toward the peripheral portions 804 of the second conductive structure 802, such that the capping structures 116 (and the dielectric structures 302) overhang sidewalls of the conductive contacts 114. However, because the capping structures 116 cover the sidewalls 808 of the second conductive structure 802 (see, e.g., FIGS. 8A-8B), the capping structures 116 prevent the second etching process from laterally etching the sidewalls 808 of the second conductive structure 802. Thus, the capping structures 116 allow the conductive contacts 114 to be formed with larger footprints (e.g., upper surface areas) than they would be if the capping structures 116 were not covering the sidewalls 808 of the second conductive structure 802 during the second etching process.

Figure 10A:
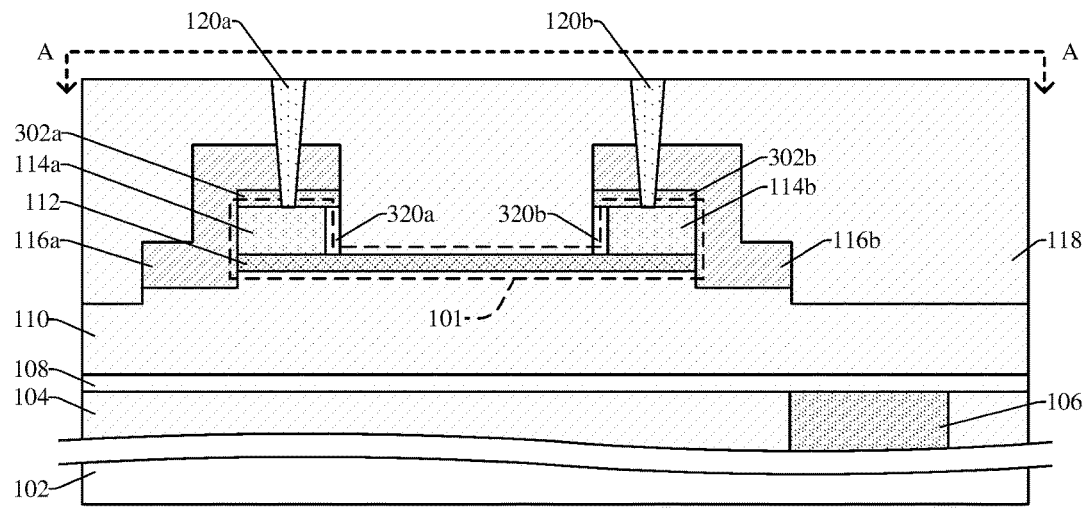
Figure 10B:
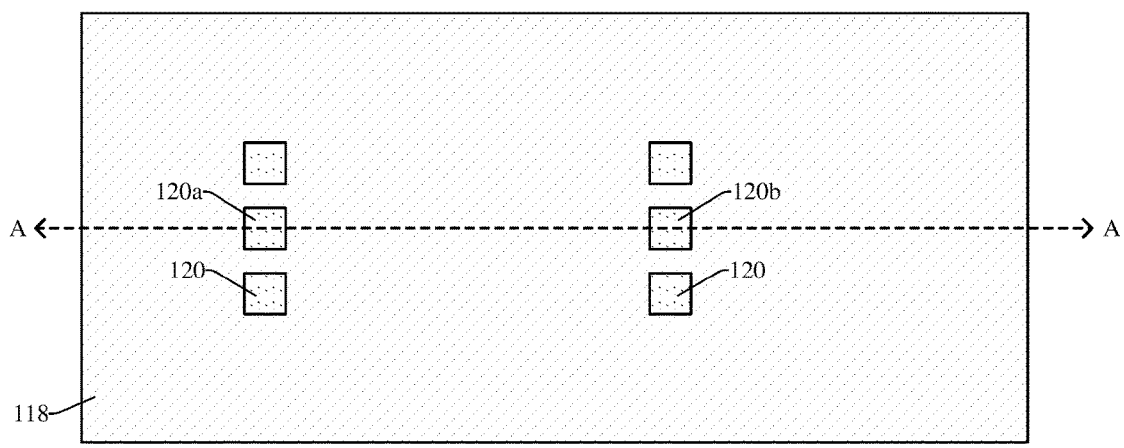

As shown in cross-sectional view 1000a of FIG. 10A and top view 1000b of FIG. 10B, a third IMD structure 118 is formed over the resistor 101, the second IMD structure 110, the dielectric structures 302, and the capping structures 116. Also shown in the cross-sectional view 1000a of FIG. 10A and the top view 1000b of FIG. 10B, a first plurality of conductive vias 120 are formed over the conductive contacts 114 and in the third IMD structure 118. The first plurality of conductive vias 120 extend vertically through the dielectric structures 302 and the third IMD structure 118. The first plurality of conductive vias 120 are electrically coupled to the conductive contacts 114. For example, a first conductive via 120a is electrically coupled to the first conductive contact 114a, and a second conductive via 120b is electrically coupled to the second conductive contact 114b.

In some embodiments, a process for forming the third IMD structure 118 and the first plurality of conductive vias 120 comprises depositing an IMD layer (not shown) over the resistor 101, the second IMD structure 110, the dielectric structures 302, and the capping structures 116. The IMD layer may be or comprise, for example, a low-k dielectric (e.g., a dielectric material with a dielectric constant less than about 3.9), an oxide (e.g., $SiO_2$), an oxy-nitride (e.g., SiON), doped silicon dioxide (e.g., carbon doped silicon dioxide), borosilicate glass (BSG), phosphoric silicate glass (PSG), borophosphosilicate glass (BPSG), fluorinated silicate glass (FSG), or the like. The IMD layer may be deposited by, for example, CVD, PVD, ALD, some other deposition process, or a combination of the foregoing. In some embodiments, because the capping structures 116 (and the dielectric structures 302) overhang the sidewalls of the conductive contacts 114 (e.g., due to the second etching process laterally etching the second conductive structure 802), the IMD layer may not be deposited vertically between (e.g., directly between) the resistive structure 112 and the dielectric structures 302, thereby resulting in cavities 320 being formed vertically between (e.g., directly between) the resistive structure 112 and the dielectric structures 302. For example, a first cavity 320a may be formed along a sidewall of the first conductive contact 114a and vertically between the first dielectric structure 302a and the resistive structure 112, and a second cavity 320b may be formed along a sidewall of the second conductive contact 114b and vertically between the second dielectric structure 302b and the resistive structure 112.

Thereafter, via openings are formed in the IMD layer and the dielectric structures 302. For example, a first via opening is formed extending vertically through the IMD layer and the first dielectric structure 302a to expose the first conductive contact 114a, and a second via opening is formed extending vertically through the IMD layer and the second dielectric structure 302b to expose the second conductive contact 114b. A conductive material (e.g., copper (Cu)) is formed on the IMD layer and in the via openings. The conductive material may be formed using a deposition process (e.g., CVD, PVD, sputtering, etc.) and/or a plating process (e.g., electrochemical plating, electroless plating, etc.). Thereafter, a planarization process (e.g., CMP) is performed on the conductive material and the IMD layer to form the first plurality of conductive vias 120 and the third IMD structure 118. Although not shown, it will be appreciated that any number of other conductive features (e.g., conductive lines and conductive vias) and/or IMD structures may be formed over the third IMD structure 118 and the first plurality of conductive vias 120.

Because the conductive contacts 114 are formed with larger footprints (e.g., due to the capping structures 116), the area (e.g., landing zones) in which the first plurality of conductive vias 120 must be formed on so that the first plurality of conductive vias 120 are electrically coupled to the conductive contacts 114 is also larger. In other words, the area in which the via openings must be aligned to land on the conductive contacts 114 is larger. Thus, it is easier to form the first plurality of conductive vias 120 on the conductive contacts 114. Accordingly, the capping structures 116 may reduce the cost to fabricate the IC comprising the resistor 101 (e.g., due to the larger footprints decreasing misalignment issues, thereby increasing device yield).

Figure 11:
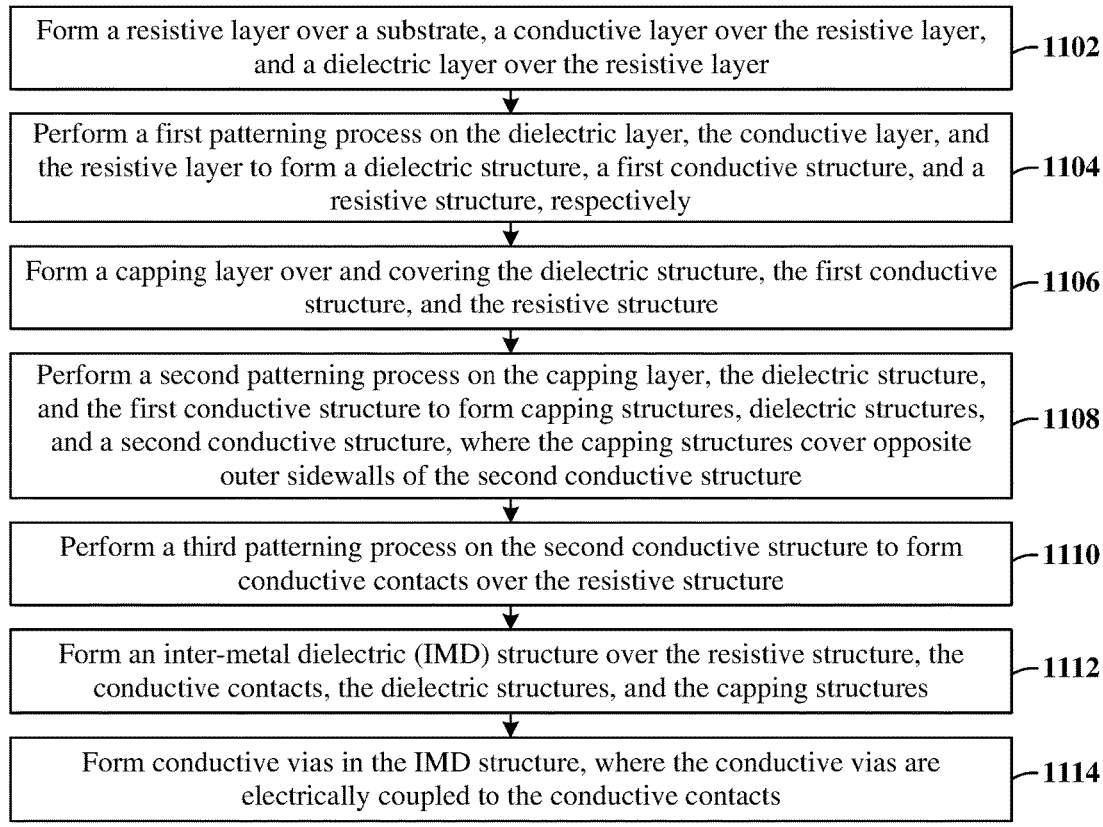
FIG. 11 illustrates a flowchart of some embodiments of a method for forming an IC comprising a resistor disposed over a substrate.

FIG. 11 illustrates a flowchart 1100 of some embodiments of a method for forming an IC comprising a resistor 101 disposed over a substrate 102. While the flowchart 1100 of FIG. 11 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1102, a resistive layer is formed over a substrate, a conductive layer is formed over the resistive layer, and a dielectric layer is formed over the conductive layer. FIGS. 5A-5B illustrate various views of some embodiments corresponding to act 1102.

At act 1104, a first patterning process is performed on the dielectric layer, the conductive layer, and the resistive layer to form a dielectric structure, a first conductive structure, and a resistive structure, respectively. FIGS. 6A-6B illustrate various views of some embodiments corresponding to act 1104.

At act 1106, a capping layer is formed over and covering the dielectric structure, the first conductive structure, and the resistive structure. FIGS. 7A-7B illustrate various views of some embodiments corresponding to act 1106.

At act 1108, a second patterning process is performed on the capping layer, the dielectric structure, and the first conductive structure to form capping structures, dielectric structures, and a second conductive structure, where the capping structures cover opposite outer sidewalls of the second conductive structure. FIGS. 8A-8B illustrate various views of some embodiments corresponding to act 1108.

At act 1110, a third patterning process is performed on the second conductive structure to form conductive contacts over the resistive structure. FIGS. 9A-9B illustrate various views of some embodiments corresponding to act 1110.

At act 1112, an inter-metal (IMD) structure is formed over the resistive structure, the conductive contact, the dielectric structures, and the capping structures. FIGS. 10A-10B illustrate various views of some embodiments corresponding to act 1112.

At act 1114, conductive vias are formed in the IMD structure, where the conductive vias are electrically coupled to the conductive contacts. FIGS. 10A-10B illustrate various views of some embodiments corresponding to act 1114.

In some embodiments, the present application provides an integrated chip (IC). The IC comprises a substrate. A resistor overlies the substrate. The resistor comprises a resistive structure overlying the substrate. The resistor also comprises a conductive contact overlying and electrically coupled to the resistive structure. A capping structure is disposed over the conductive contact, wherein the capping structure extends laterally over an upper surface of the conductive contact and vertically along a first sidewall of the conductive contact, such that a lower surface of the capping structure is disposed below a lower surface of the conductive contact.

In some embodiments, the present application provides an integrated chip (IC). The IC comprises a substrate. A first intermetal dielectric (IMD) structure overlies the substrate. A resistor overlies the first IMD structure. The resistor comprises a resistive structure overlying the first IMD structure. The resistor also comprises a first conductive contact overlying and electrically coupled to the resistive structure, wherein a sidewall of the first conductive contact is substantially aligned with a first sidewall of the resistive structure. A first capping structure is disposed over the first conductive contact, wherein the first capping structure covers an upper surface of the first conductive contact, and wherein the first capping structure extends vertically along both the sidewall of the first conductive contact and the first sidewall of the resistive structure.

In some embodiments, the present application provides a method for forming an integrated chip (IC). The method comprises forming a resistive layer over an inter-metal dielectric (IMD) structure. A conductive layer is formed over the resistive layer. The resistive layer and the conductive layer are patterned to form a resistive structure and a conductive structure, respectively. A capping layer is formed over the resistive structure and the conductive structure, wherein the capping layer is formed over an upper surface of the conductive layer, along sidewalls of the resistive structure, and along sidewalls of the conductive structure. The capping layer is patterned to form a capping structure over the conductive structure. The conductive structure is patterned to form a conductive contact over the resistive structure and below the capping structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip (IC), the method comprising:
    forming a resistive layer over an inter-metal dielectric (IMD) structure;
    forming a conductive layer over the resistive layer;
    patterning the resistive layer and the conductive layer to form a resistive structure and a conductive structure, respectively;
    forming a capping layer over the resistive structure and the conductive structure, wherein the capping layer is formed over an upper surface of the conductive structure, along sidewalls of the resistive structure, and along sidewalls of the conductive structure;
    patterning the capping layer to form a capping structure over the conductive structure;
    patterning the conductive structure to form a conductive contact over the resistive structure and below the capping structure, and to form an additional conductive contact separated from the conductive contact by a gap that exposes a top surface of the resistive structure, wherein the conductive contact and the additional conductive contact respectively have a first sidewall and a second sidewall facing each other in the gap; and
    depositing a dielectric layer filling the gap, wherein a first cavity and a second cavity are respectively at the first sidewall and the second sidewall at completion of the depositing.

2. The method of claim 1, wherein:
    patterning the capping layer comprises performing a dry etching process on the capping layer; and
    patterning the conductive structure comprises performing a wet etching process on the conductive structure.

3. The method of claim 1, wherein the resistive structure and the conductive structure form a common sidewall, and wherein the capping layer lines the common sidewall throughout the patterning to form the conductive contact.

4. The method of claim 1, wherein the patterning of the conductive structure undercuts the capping structure.

5. The method of claim 1, wherein the patterning of the capping layer forms a recess in the conductive structure, wherein the conductive structure and the capping structure respectively have a third sidewall and a fourth sidewall forming a common sidewall in the recess, and wherein the patterning of the conductive structure laterally recesses the third sidewall relative to the fourth sidewall, and wherein the third sidewall, after being laterally recessed, corresponds to the first sidewall of the conductive contact.

6. A method for forming an integrated chip (IC), the method comprising:
    forming a resistive structure over a substrate;
    forming a conductive structure overlying the resistive structure, wherein the conductive structure has a first sidewall and a second sidewall facing opposite directions respectively on opposite sides of the conductive structure;
    depositing a dielectric capping layer lining, and laterally and directly contacting the first and second sidewalls;
    performing a first etch into the conductive structure to form a recess between the first and second sidewalls, wherein the first etch stops before exposing the resistive structure; and
    performing a second etch into the conductive structure to extend the recess to the resistive structure between the first and second sidewalls, wherein the first and second sidewalls are lined by the dielectric capping layer throughout the second etch.

7. The method of claim 6, wherein the second etch stops at a top surface of the resistive structure.

8. The method of claim 6, wherein the first etch is a dry etch, and wherein the second etch is a wet etch.

9. The method of claim 6, wherein the second etch has a higher etch rate for the conductive structure than for the dielectric capping layer.

10. The method of claim 6, wherein the second etch laterally etches the conductive structure from the recess, such that a width of the recess is greater at a bottom of the recess than at a top of the recess.

11. The method according to claim 6, wherein the second etch undercuts the dielectric capping layer, such that the dielectric capping layer overhangs a portion of the recess between the first and second sidewalls at completion of the second etch.

12. The method according to claim 11, wherein the method further comprises:
    depositing a dielectric layer in the recess between the first and second sidewalls after the second etch, wherein the portion of the recess is unfilled at completion of the depositing of the dielectric layer.

13. The method according to claim 12, further comprising:
    forming a dielectric structure overlying the conductive structure before the depositing of the dielectric capping layer, wherein the second etch undercuts the dielectric structure, such that the dielectric structure also overhangs the portion of the recess between the first and second sidewalls at completion of the second etch.

14. The method according to claim 6, wherein the second etch divides the conductive structure into a pair of conductive contacts, which entirely overlie the resistive structure and comprise individual portions of the conductive structure respectively having the first and second sidewalls, and wherein the method comprises:
    forming a pair of conductive vias overlying and directly contacting the pair of conductive contacts, respectively, and laterally and directly contacting the dielectric capping layer between the first and second sidewalls.

15. The method according to claim 14, wherein the recess is continuous linearly from a first one of the pair of conductive contacts to a second one of the pair of conductive contacts.

16. The method according to claim 6, wherein the dielectric capping layer consists essentially of silicon nitride or silicon oxynitride.

17. A method for forming an integrated chip (IC), the method comprising:
    depositing a resistive layer over a substrate;
    depositing a conductive layer over the resistive layer;
    depositing a dielectric layer overlying the conductive layer;
    performing a first etch into the conductive layer, the dielectric layer, and the resistive layer to form a multilayer structure comprising a portion of the resistive layer, a portion of the dielectric layer, and a portion of the conductive layer, wherein the multilayer structure comprises a pair of sidewalls facing opposite directions respectively on opposite sides of the multilayer structure;

depositing a capping layer overlying the multilayer structure and lining the pair of sidewalls; and removing a central portion of the multilayer structure, between the pair of sidewalls, to expose a top surface of the resistive layer, wherein the removing undercuts the dielectric layer, such that the dielectric layer overhangs a cavity at completion of the removing.

18. The method of claim 17, wherein the pair of sidewalls are formed partially by the conductive layer and are lined by the capping layer before and after the removing.

19. The method of claim 17, wherein the removing comprises:

performing a second etch that is anisotropic into the capping layer and the multilayer structure, wherein the second etch stops before reaching the resistive layer; and performing a third etch that is isotropic into the multilayer structure to expose the resistive layer.

20. The method of claim 17, wherein the resistive layer is deposited over a conductive wire, and wherein the method further comprises:

forming conductive vias extending to the conductive layer respectively on the opposite sides of the multilayer structure.

\* \* \* \* \*